United States Patent

[11] 3,604,987

[72] Inventor Jacques M. Assour
Princeton, N.J.
[21] Appl. No. 781,753
[22] Filed Dec. 6, 1968
[45] Patented Sept. 14, 1971
[73] Assignee RCA Corporation

[54] RADIATION-SENSING DEVICE COMPRISING AN ARRAY OF PHOTODIODES AND SWITCHING DEVICES IN A BODY OF SEMICONDUCTOR MATERIAL
10 Claims, 4 Drawing Figs.

[52] U.S. Cl. .......... 250/209, 250/211, 250/220, 317/235
[51] Int. Cl. .......... H01l 11/00
[50] Field of Search .......... 250/209, 211 S, 220 MX; 317/235

[56] References Cited

UNITED STATES PATENTS 3,270,235 8/1966 Loebner .......... 250/211 J
3,296,502 1/1967 Gross et al. .......... 250/211 J
3,304,430 2/1967 Biard et al. .......... 250/211 J
3,400,272 9/1968 Dym et al. .......... 250/211 J
3,448,275 6/1969 Hall .......... 250/211 J
3,473,032 10/1969 Lehovee .......... 250/211 J
3,478,214 11/1969 Dillman .......... 250/211 J

*Primary Examiner*—James W. Lawrence
*Assistant Examiner*—C. M. Leedom
*Attorney*—Glenn H. Bruestle

ABSTRACT: A device for converting patterns of light into electrical signals includes a body of intrinsic silicon having opposed major surfaces. Regions of one type conductivity in the body adjacent to one of the major surfaces and regions of relatively opposite type conductivity adjacent to the other major surface, separated by material of the body of predetermined thickness, define an $x$–$y$ array of high-speed PIN photodiodes. Other regions adjacent to the one major surface define low capacitance PIN switching diodes for isolating the photodiodes.

INVENTOR

Jacques M. Assour

BY Robert P. Williams

ATTORNEY

INVENTOR
Jacques M. Assour
BY Robert P. Williams
ATTORNEY

RADIATION-SENSING DEVICE COMPRISING AN ARRAY OF PHOTODIODES AND SWITCHING DEVICES IN A BODY OF SEMICONDUCTOR MATERIAL

BACKGROUND OF THE INVENTION

This invention relates to semiconductor photodetector arrays. More particularly, the invention pertains to an integrated array of efficient high-speed photosensing diodes adapted to convert optical information into electrical signals.

In a number of applications, information in the form of radiation must be converted into electrical signals so that it can be processed, as, for example, by a digital data processing machine. Image-scanning devices such as vidicons, image orthicons, or the like or arrays of radiation-sensing elements such as photoconductors, phototransistors, photodiodes or the like have been employed for this purpose. The light sources employed have been patterns of light such as that made by exposing a punched card to a light source.

In some opto-electronic data processing systems, coherent light sources such as gas lasers and solid-state light-emitting devices have been employed. The photodetectors used with these light sources should operate at relatively high speeds. Thy must be sensitive to the particular spectral output of the light sources and must be efficient and capable of integration in relatively large arrays, particularly in those instances where a substantial amount of information is handled.

SUMMARY OF THE INVENTION

The present radiation-sensing device includes a body of semiconductor material having a pair of opposed major surfaces. Regions within the body define a plurality of photodiodes, each having one region adjacent to one major surface of the body and the other region adjacent to the the other major surface of the body. Switching means are provided adjacent to one of the major surfaces of the body to isolate each of the photodiodes from the others and thus to prevent crosstalk.

THE DRAWING

THE PREFERRED EMBODIMENT

Figure 1:
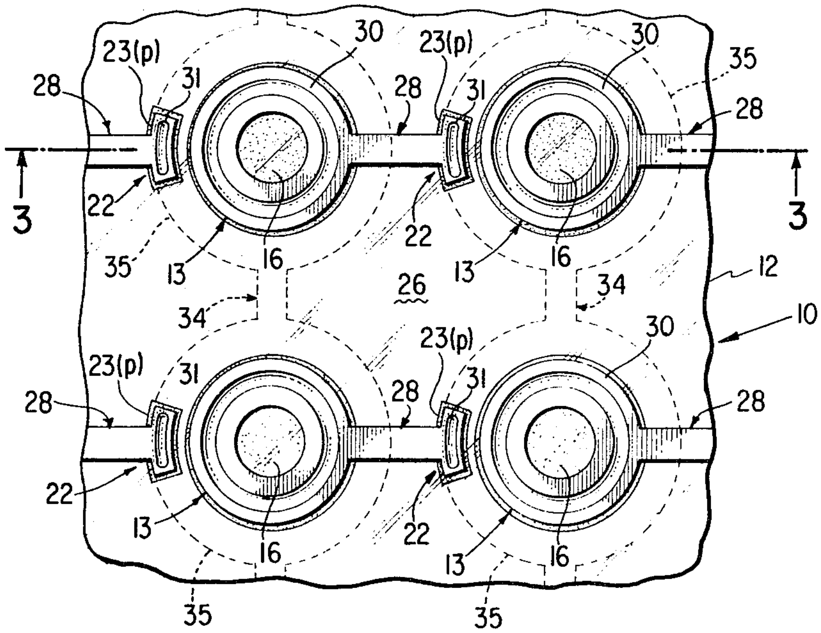
FIG. 1 is a fragmentary top plan view of he the present radiation-sensing device.
Figure 2:
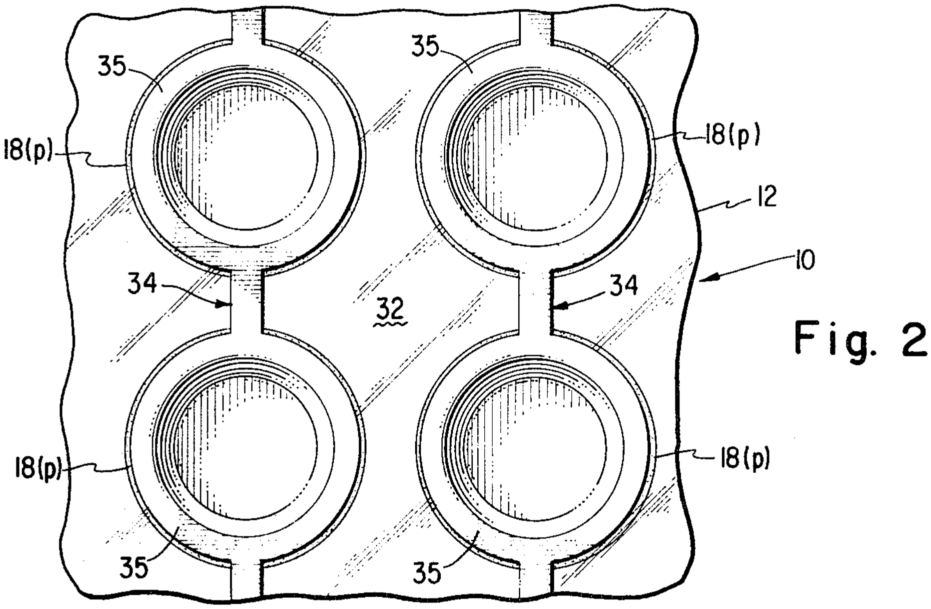
FIG. 2 is a fragmentary bottom plan view of the present device.
Figure 3:
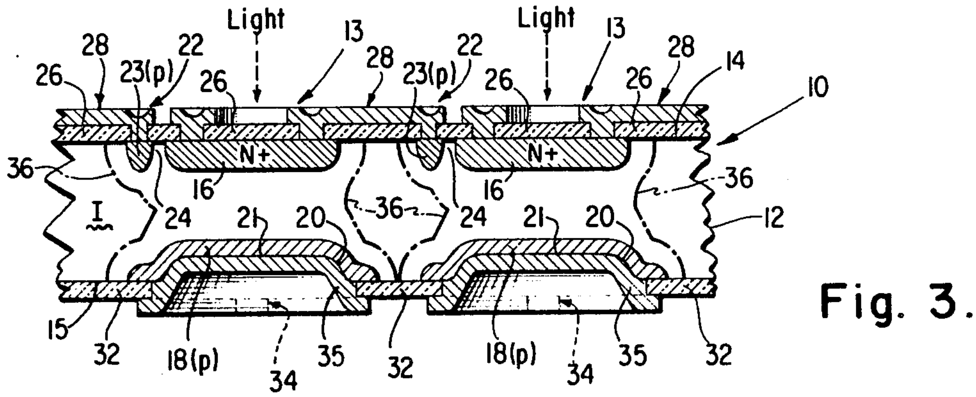
FIG. 3 is cross-sectional view taken on the line 3—3 of FIG. 1.

The present radiation-sensing device, in a preferred form thereof, is indicated generally by the numeral 10 in FIGS. 1 to 3. The radiation-sensing device 10 includes a body 12 of semiconductive material such silicon, which has first and second opposed major surfaces 14 and 15, respectively. Initially, the material of the body 12 is of substantially intrinsic semiconductivity.

A plurality of PIN photodiodes 13 are contained within the body 12. Each photodiode 13 includes a diffused region 16 of one type conductivity, N-type in this example, adjacent to the surface 14 of the body 12 and a region 18 of conductivity-type opposite to that of the region 16 adjacent to the opposite major surface 15 in opposed relation to each of the N-type regions 16. The regions 16 and 18 are spaced from each other by a portion of the intrinsic body 12 of predetermined width. In order to provide structural strength and also to provide an optimum width of the spacing portion of the body 12, the body is thicker than is necessary to fabricate the photodiodes 13 themselves and a plurality of recesses 20 are provided to define an array of minor surfaces 21 spaced inwardly from the major surface 15 of the body 12. The total thickness of each photodiode 13 is thus the distance between the surfaces 14 and 21, which is the sum of the width of the spacing portion of the body 12 and the depths of diffusion of the regions 16 and 18.

A plurality of switching devices 22, each one associated with one of the PIN photodiodes is included in the body 12 adjacent to the surface 14 thereof. The switching devices may be PN junctions, PIN structures, insulated gate field effect transistors, bipolar transistors, or any other semiconductor device capable of switching between a conductive and a relatively nonconductive state on the present embodiment, each switching device 22 comprises a region of P-type conductivity, in the body 12 adjacent to the surface 14 and adjacent to each of the N-type regions 16. The regions 22 are relatively small and are spaced from the periphery edge of each region 16 by a portion 24 of the body 12. They each therefore define, with an N-type region 16, rectifying devices of relatively low capacitance.

The switching devices 22 are connected in a plurality of rows with the devices 22 in each row connected in series in the same conducting direction. For this purpose, there is a layer of transparent insulating material 26 on the surface 14 of the body 12. The insulator layer 26 has openings therein adjacent to those regions to which contact is desired.

Figure 4:
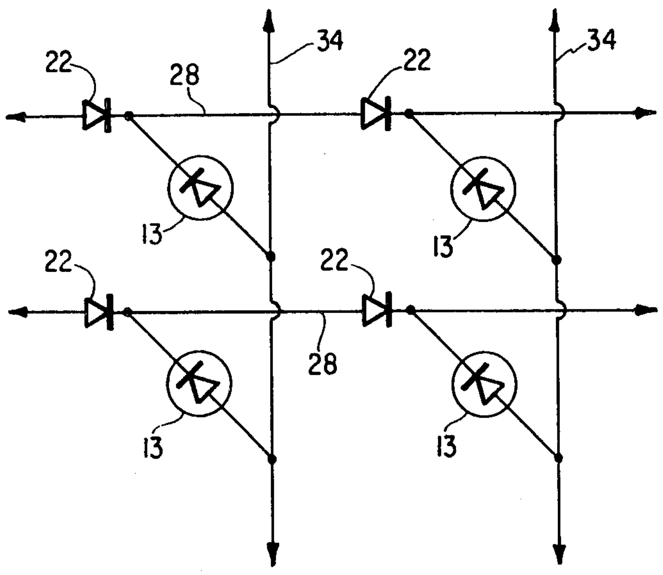
FIG. 4 is a circuit diagram showing the equivalent circuit of the semiconductor devices included in the device of the other FIGS.

A plurality of conductive metal layers 28 are provided on the insulating layer 26 in interconnecting relation to the semiconductive regions 22 and 16. Each conductive layer 28 has a ring-shaped portion 30 extending through a suitably shaped opening in the insulating layer 26 into contact with one of the N-type regions 16. The shape of portion 30 provides a good, large area contact while permitting light to penetrate to the active portions of the photodiode 13. At the end of each conductive element 28 opposite from the ring-shaped portions 30, there is a portion 31 which extends into contact with one of the P-type regions 22. The switching devices are thus connected together as a plurality of rows of diodes in series as indicated in the equivalent circuit diagram of FIG. 4 wherein the same reference numerals are applied to corresponding elements. The only difference between the structure and the equivalent circuit diagram which is of note is the fact that the N-type regions of the switching devices and the photodiode are one common region in the preferred structure.

The P-type regions 18 adjacent to the opposite major surface 15 of the body 12 are connected in a plurality of parallel columns extending, in this example, at a right angle to the direction of the rows of switching devices 22. For this purposes, there is an insulating layer 32 on the major surface 15 of the body 12 which is provided with openings adjacent to each of the regions 18. Disposed on the insulating layer 32 are a plurality of generally parallel conductive layers 34, each of which is provided with a plurality of enlarged portions 35 extending into contact with the regions 18. In the equivalent circuit diagram of FIG. 4, the metal layers 34 are shown as column conductors.

In the operation of the present device, a row is selected and the series-connected switching devices 22 in the selected row are biased into forward conduction. The biasing voltages and the voltages applied to the conductors 34 are selected such that when the switching devices 22 are forward biased, the photosensing diodes 13 are reverse biased by an amount sufficient to cause the depletion layer associated with each diode to spread throughout the entire volume of the intrinsic material between the respective N+ regions 16 and P regions 18. In FIG. 3, the boundaries of the depletion region are suggested by the dashed lines 36. In this condition, each photodiode 13 will act as a current generator in which the mount of current is a function of the light which falls on the photodiode 13 and is admitted through the opening in the ring-shaped portion 30 of the metallization 28.

In the use of the present array in a digital system, the presence or absence of light on a given photodiode 13 may be interpreted as either a "1" or a "0" in a binary word. When no radiation is incident on a particular device, the "dark current"

flowing through the device is due mainly to thermally generated electronthole pairs. This dark current is extremely small and may be of the order of $10^{17}$ amps/cm.$^2$. When a photodiode 13 is illuminated with an amount of radiation sufficiently energetic to excite electron-hole pairs by direct ionization across the forbidden gap of the semiconductor material, current will flow in the output which is of substantially greater magnitude than the dark current. The amount of photocurrent is also proportional to the quantum efficiency of the diode. These currents, either high or low, depending on the state of the incident illumination, may be then interpreted as digital information.

The speed of response of each of the photodiodes 13 to incident radiation should be high for digital applications. The speed of response of each photodiode 13 is a function of (1) the effective area which, in this example, is about equal to the area of the opposed parallel portions of the regions 16 and 18, and of (2) the width of the intrinsic region between the regions 16 and 18. More particularly, the speed of response may be determined by either of two parameters, namely, the transit time $\tau_r$ of the photoexcited carriers across the width of the intrinsic region or the time constant $\tau_L$ of the equivalent electrical network, which consists of the capacitance of the photodiode in shunt with a resistive load. The transit time of the photo-generated carriers is approximately given by the relation $$\tau_r = W/2v,$$

where $W$ equals the width of the depletion layer, which is equal in turn to the width of the intrinsic region under the conditions of complete depletion thereof, and $v$ equals the drift velocity of the electrical carriers, which is a function of the applied bias. The time constant of the equivalent electrical network is given by the relation $$\tau_L = R_L C \cong R_L \epsilon A/W$$

where again $W$ is the width of the intrinsic region, $A$ is the area of the photodiode and $\epsilon$ is the dielectric constant of silicon.

Since the transit time is directly proportional to $W$ and the time constant is inversely proportional to $W$, an optimized value for the speed of response may be obtained by adjusting the design parameters so that the ratio of the transit time to the time constant is equal to unity, as shown in the following expression $$\tau_r/\tau_L = W/2v/R_L \epsilon A/W = W^2/2v\epsilon A R_L = 1$$

The efficiency of the photodiodes is a function of the amount of light that falls within the intrinsic region thereof. Some of the incident light is reflected by the silicon dioxide layer 26 and some is absorbed by the N+ region 16. There is also some loss due to multiple reflections within the silicon dioxide layer 26 and the amount of this loss is a function of the thickness of the layer 26. For practical purposes, the silicon dioxide layer 26 should be made as thin as possible consistent with protection of the silicon surface, and the depth of diffusion of the regions 16 should be kept small to minimize the absorption in this region. Typically, the oxide coating may by 0.15 microns thick and the depth of diffusion of the regions 16 may be about 5 microns.

An array constructed in accordance with the foregoing principles in which each photodiode may have a response time of about 1 nanosecond, a quantum efficiency of about 0.7, and a spectral response between about 4,000 A. and about 11,000 A. may be constructed by the following process. The starting wafers are lightly doped N-type silicon with a resistivity of about 1,000 ohm cm. Their surfaces 14 and 15 are oriented parallel to the (111) planes of the silicon. The thickness of the starting wafer is 80 to 100 microns, which has been found to be about the minimum thickness of a silicon wafer which can be safely handled during processing. This thickness, however, is about twice that required for the high-speed diode desired. In order to achieve the proper thickness for the photodiodes, the recesses 20 are etched in the silicon wafer to a depth of about 50 microns, so that a corresponding 50 microns of silicon remain. The layer of silicon dioxide 32 may be used as a mask against the etching of the silicon. A suitable etching solution consists of a mixture of 93 parts of nitric acid and 7 parts of hydrofluoric acid. Such a solution will etch a (111) face of silicon at about 5 microns per minute.

After the completion of the etching of the recesses 20, a new oxide layer is grown on the exposed surface of the silicon and diffusion windows for the regions 16 and 18 are then etched in the new silicon dioxide coating. The regions 16 and 18 are preferably formed by simultaneous solid-to-solid diffusion as follows. First, doped silicon dioxide coatings are deposited in the diffusion windows in the oxide coating. These doped oxides contain boron and phosphorus for the P-type and N-type regions, respectively. The wafer, with the doped oxide diffusion sources thereon, is then heated to about 1,200° C. to cause impurities to migrate from the doped oxide diffused sources into the silicon. The duration of the diffusion heat treatment is selected such that the impurities are driven in to a depth of about 5 microns.

After the completion of the solid-to-solid diffusion step, the doped oxide diffusion sources are removed and a new oxide is grown. This last oxide is the coating 26 and the coating 32 in the finished device. Contact openings are etched and the metallization is then applied by known photolithographic techniques.

I claim:

1. A radiation-sensing device comprising:

a body of semiconductive material having first and second opposed major surfaces, means in said body defining an array of photodiodes, each photodiode comprising a first region of one type conductivity extending into said body from said first major surface and a second region of conductivity type opposite to that of said first region extending into said body from said second major surface, and means in said body defining a plurality of switching devices, each switching device including a third region of conductivity type opposite to that of said first region extending into said body from said first major surface.

2. A radiation-sensing device as defined in claim 1 wherein said third region is disposed adjacent to one of said first regions whereby each of said switching devices is comprised of one of said third regions and one of said first regions.

3. A radiation-sensing device as defined in claim 2 adapted to receive radiation on said first major surface thereof, said device further comprising a coating of relatively transparent insulating material on said surface and conductive means on said insulating material for establishing electrical contact to said first region.

4. A radiation-sensing device as defined in claim 3 wherein each said conductive means has a ring-shaped portion adapted to admit radiation through the opening thereof to said photodiodes.

5. A radiation-sensing device as defined in claim 1 wherein said body outside of said regions is substantially intrinsic.

6. A radiation-sensing device as defined in claim 5 wherein said first and second regions are spaced from each other by a predetermined distance.

7. A radiation-sensing device as defined in claim 6 wherein said body has recesses adjacent to each of said second regions, each recess having a surface spaced from said first major surface by a distance greater than said predetermined distance by an amount equal to the sum of the depths of diffusion of said first and second regions.

8. A radiation-sensing device comprising a body of substantially intrinsic monocrystalline silicon having first and second spaced, parallel major surfaces, said body being of predetermined thickness and having a plurality of recesses in said second major surface for defining a plurality of minor surfaces, each spaced from said first major surface by a predetermined distance, said recesses being arranged in rows and columns, means in said body defining an array of photodiodes arranged in rows and columns, each photodiode comprising a region of one type conductivity in said body adjacent to said first major surface and disposed opposite to a recess and a region of conductivity type opposite to that of said first-mentioned region in said body adjacent to a recess, means in said body defining a plurality of switching devices, each switching device including a region of said opposite type conductivity in said body adjacent to said first major surface and adjacent to one of said first-mentioned regions, a coating of electrically insulative material on each of said major surfaces, said coatings having a plurality of openings, one adjacent to each of said regions, conductive means joining the switching devices in each row in series, said conductive means comprising a plurality of deposited metal conductors each extending in the row direction from one of said regions of one type conductivity adjacent to said first major surface, and conductive means interconnecting each of said regions of opposite type conductivity adjacent to said recesses in each column.

9. A radiation-sensing device as defined in claim 8 wherein said regions of said photodiodes are spaced from each other whereby said photodiodes are PIN structures.

10. A radiation-sensing device as defined in claim 9 wherein the regions of said switching devices are spaced from each other whereby said switching devices are PIN structures.